United States Patent [19]

Moslehi

[11] Patent Number: 5,372,969
[45] Date of Patent: Dec. 13, 1994

[54] LOW-RC MULTI-LEVEL INTERCONNECT TECHNOLOGY FOR HIGH-PERFORMANCE INTEGRATED CIRCUITS

[75] Inventor: Mehrdad M. Moslehi, Dallas, Tex.

[73] Assignee: Texas Instruments Incorporated

[21] Appl. No.: 845,125

[22] Filed: Mar. 3, 1992

Related U.S. Application Data

[63] Continuation-in-part of Ser. No. 816,456, Dec. 31, 1991.

[51] Int. Cl.⁵ .................. H01L 21/44; H01L 21/48
[52] U.S. Cl. .................................. 437/195; 437/51; 437/927
[58] Field of Search ............... 437/195, 209, 219, 927, 437/228, 51

[56] References Cited

U.S. PATENT DOCUMENTS

| | | | |
|---|---|---|---|
| 4,918,032 | 4/1990 | Jain et al. | 437/228 |
| 4,980,034 | 12/1990 | Volfson | 437/195 |
| 5,000,818 | 3/1991 | Thomas et al. | 437/195 |

FOREIGN PATENT DOCUMENTS

| | | |
|---|---|---|
| 0129476 | 12/1984 | European Pat. Off. |
| 0296641 | 11/1989 | Japan |
| 0086147 | 3/1990 | Japan |
| 0237136 | 9/1990 | Japan |

Primary Examiner—Tom Thomas
Attorney, Agent, or Firm—John D. Crane; Wade James Brady, III; Richard L. Donaldson

[57] ABSTRACT

A high-performance "low-RC" multi-level interconnect technology has been conceived for advanced sub-0.5 μm semiconductor technologies. The proposed structure and fabrication process has a number of significant characteristics: (i) compatible with various metal systems (Al, Cu, W, etc.), (ii) free-space interlevel dielectrics; (iii) compatible with standard semiconductor fabrication processes, (iv) excellent mechanical stability; and (v) compatible with hermetically sealed chip packaging techniques. Compared with an Al-based conventional interconnect technology, the new interconnect system can reduce the "RC" delay by a factor of −6. The proposed interconnect technology offers major chip performance improvements such as lower power dissipation and higher operating frequencies. This technology is based on a manufacturable process to fabricate multilevel interconnect with free-space dielectrics and a technology scaling enabler.

10 Claims, 7 Drawing Sheets

LOW-RC MULTI-LEVEL INTERCONNECT TECHNOLOGY FOR HIGH-PERFORMANCE INTEGRATED CIRCUITS

This application is a continuation-in-part of application Ser. No. 07/816,456, entitled Advanced Low RC Multi-Level Interconnect Technology for High Performance Integrated Circuits, filed on Dec. 31, 1991 by Mehrdad M. Moslehi.

BACKGROUND OF THE INVENTION

Interconnect parasitic resistance (R) and capacitance (C) elements will become the most significant problems as the semiconductor technologies (complementary-metal-oxide semiconductor or CMOS, bipolar, bipolar complementary metal-oxide-semiconductor or BiCMOS scale below 0.5 ($\mu$m) micrometers. The parasitic resistance and capacitance elements associated with the aluminum-based (or refractory metal-based) metallization systems can degrade the circuit electrical performance due to the RC-induced propagation delays. Moreover, these interconnect parasitic elements increase the overall chip power dissipation and increase the amount of signal cross talk. As a result, conception and development of suitable low-RC-multi-level interconnect technologies will be among the most important and critical enablers for scaling advanced semiconductor technologies well below 0.5 $\mu$m a minimum features for ultra-large-scale integrated (ULSI) system applications.

Prior Art Solutions

It is clear that the low-RC high-performance interconnect systems require either low-resistance metal lines or low-permittivity dielectrics, or preferably both together. Most of the prior art techniques to date have focused on development of low-resistance metallization systems without any emphasis on parasitic capacitance reduction. These prior art techniques include:

Copper metallization by physical-vapor deposition, (PVD), chemical vapor deposition (CVD), or electroless deposition (bulk resistivity=1.7 $\mu\Omega$ Cm.).

=Gold metallization by electroless deposition or other techniques.

Low-temperature such as liquid-nitrogen (77K) aluminum based metallization systems (over 5 times reduction in Al resistivity at 77K compared to that at 25° C).

Superconducting transmission line interconnects.

Despite the higher circuit performance offered by these alternatives metal interconnect systems, the room-temperature Al-based interconnects remain the dominant metallization technology for silicon integrated circuits. This is due to the fact that AL-based interconnect processes are well established and mature.

Little development work has been done in the area of low-permittivity dielectrics for integrated circuit (IC) metallization. Silicon dioxide undoped and doped oxide has been the dominant interlevel dielectric material used in silicon-based IC technologies. Some high-speed gallium arsenide (GaAs) technologies have employed single-level air bridges in order to reduce the device interconnection delay. However, the conventional air bridge techniques are not compatible with advanced silicon techniques with multiple metal interconnect levels and hermetically sealed chip packages.

As a result, there is a need for a manufacturable low-RC high-performance interconnect technology compatible with standard semiconductor technologies and hermetically sealed chip packages. A manufacturable low-RC interconnect technology must be easily applicable to advanced semiconductor technologies with multiple planarized layers of metals (e.g. 2 or more). The overall device manufacturing yield and chip reliability must be at least as good as those of conventional metallization techniques.

BRIEF DESCRIPTION OF THE DRAWINGS

FIGS. 1 through 2a, 3 through 9 and 13 through 23 illustrate cross-sectional views of a representative semiconductor device structure fabricated according to the processing steps described herein.

DETAILED DESCRIPTION OF THE INVENTION

The invention allows formation of free space air gap ($\epsilon_r=1$) interlevel dielectrics between adjacent metal levels in a multi-level metallization system. The metal lines can be made of any suitable conductive material such as Al, tungsten (W), copper (Cu), gold (Au), etc. The metallization system of this invention will offer excellent mechanical stability and overall reliability. The fabrication process complexity is comparable to and compatible with the conventional metallization techniques. The process flow described in the following will be based on the use of copper metallization (formed by chemical-vapor deposition. However, the multi-level metallization fabrication flow of this invention is fully compatible with any metal material system and various metal deposition techniques. Due to its low electrical resistivity (1.7 $\mu\Omega$.cm for Cu vs 2.7 $\mu\Omega$. cm for Al), copper will be the preferred material for advanced sub-0.5 $\mu$m CMOS/BiCMOS and bipolar technologies. The combination of copper metallization with the free space interlevel dielectric of this invention can reduce the RC interconnect delay by as much as $2.7/1.7 \times 3.9 = 6$ times compared to the existing Al-based multi-level metallization systems. It should be noted that the impact of the free space interlevel dielectric technology of this invention on RC reduction and circuit performance is much larger than that of replacing Al with a lower resistivity material such as copper. Simulations of interconnect delay have indicated that reduction of the interlevel dielectric permittivity results in a more significant circuit performance improvement that reduction of the metal resistivity. Besides interconnect parasitic RC related delay reduction, the interconnect technology of this invention will also reduce the overall chip power dissipation and signal cross-talk (both level-to-level and in-plane cross talk) by significant factors.

Assumptions for the following fabrication flow are:

1. Copper is used as metal (other metals such as aluminum or tungsten may also be used).

2. Silicon nitride is used as a passavation/encapsulation layer on copper.
3. Silicon oxide (doped, undoped, or a combination thereof) is used as a disposable interlevel dielectric (single crystal Si or polysilicon may also be used as a disposable interlevel material).
4. Silicon nitride is used as an interlevel mechanical support material (silicon dioxide may also be used for mechanical support if a material such as silicon is used as a disposable interlevel material).
5. The process employs a well-established planarization technique such as phosphosilicate glass (PSG)/or borophosphosilicate glass (BPSG) reflow and/or resist etch-back.

Preferred process flow is as follows:

This process flow shall be described under the assumption that copper is used as the metal material (a fairly similar flow can be used with Al-based conductors).

Figure 1:
Figure 2A:
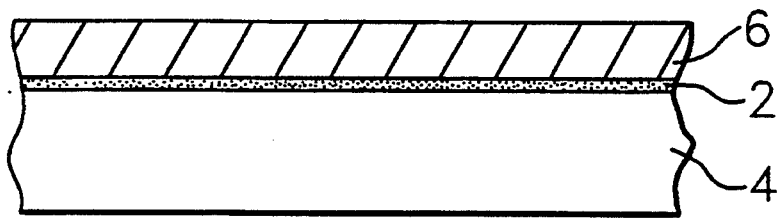
Figure 2B:
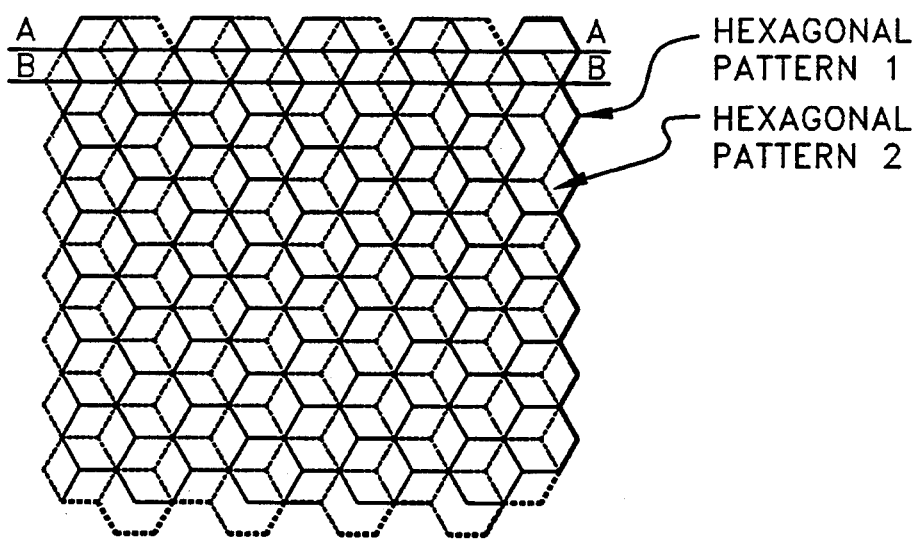
FIG. 2b illustrates the two superimposed hexagonal mask patterns used for fabrication of the hexagonal nitride support structures separating different metal interconnect levels.
Figure 3:
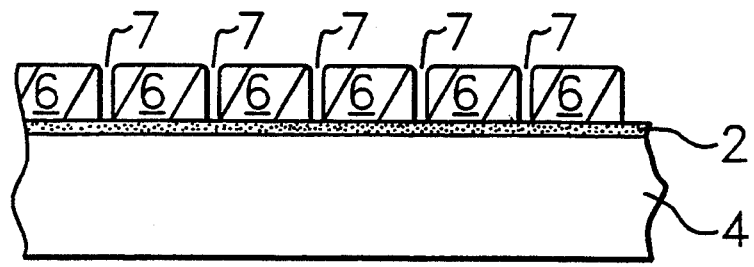
Figure 4:
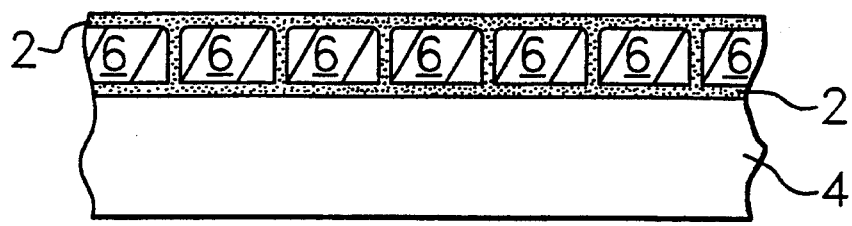
Figure 5:
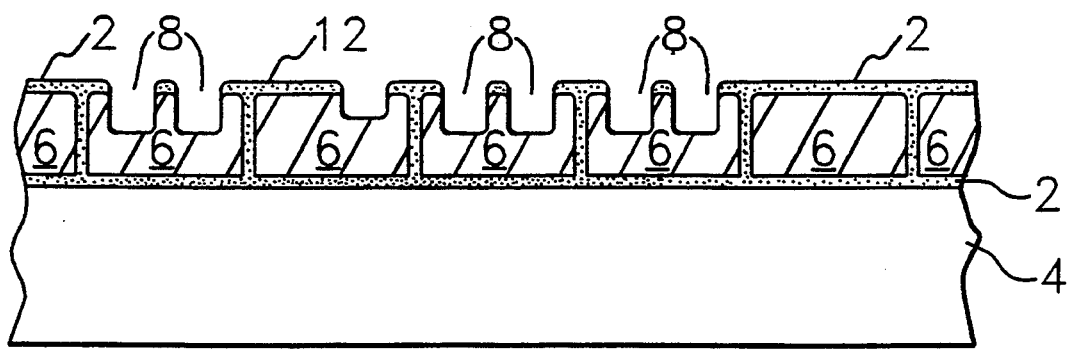
Figure 6:
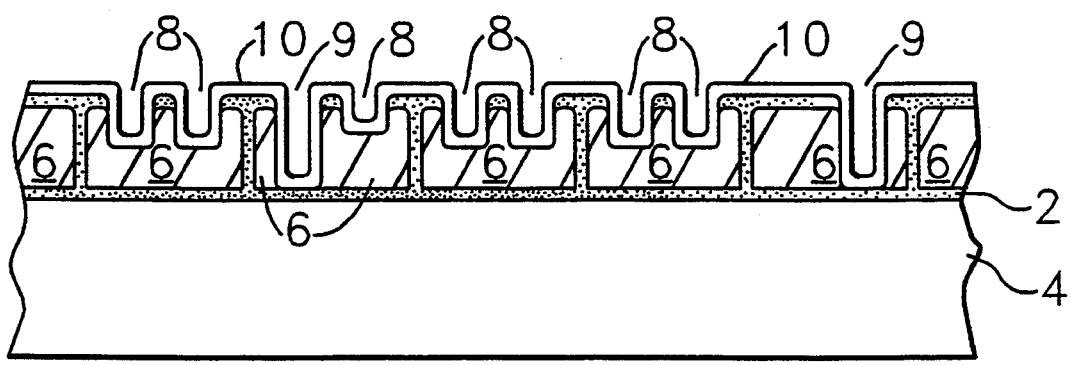
Figure 7:
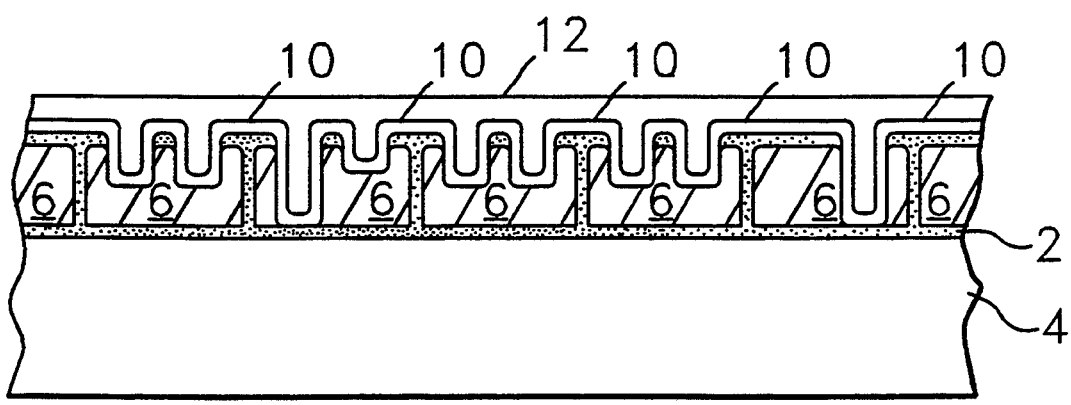
Figure 8:
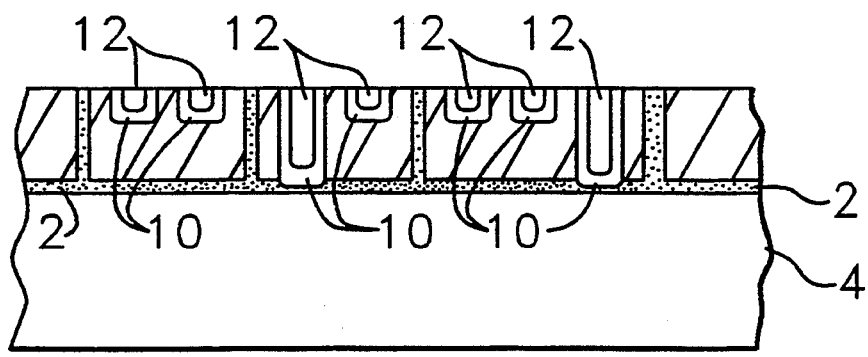
Figure 9:
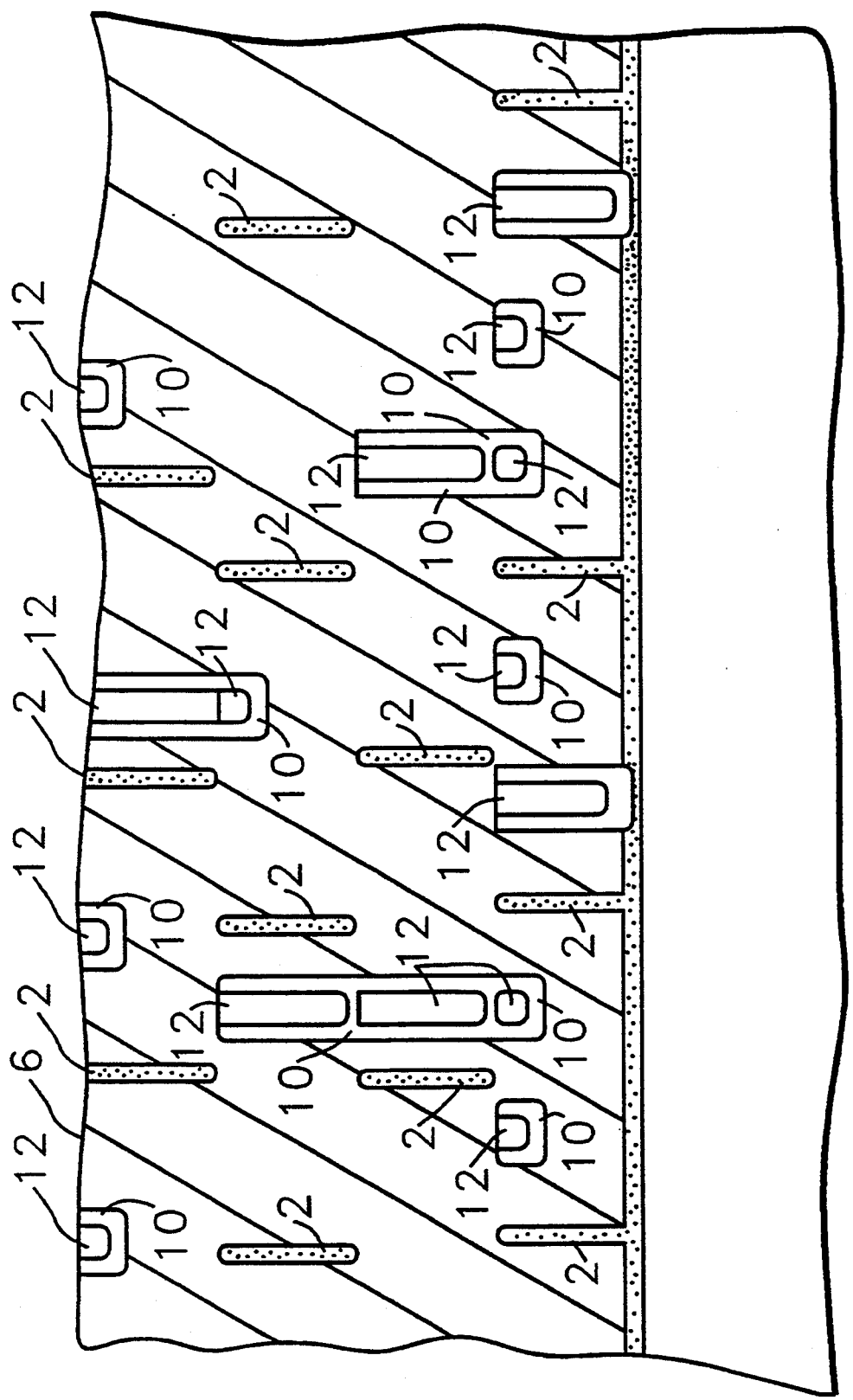
Figure 10:
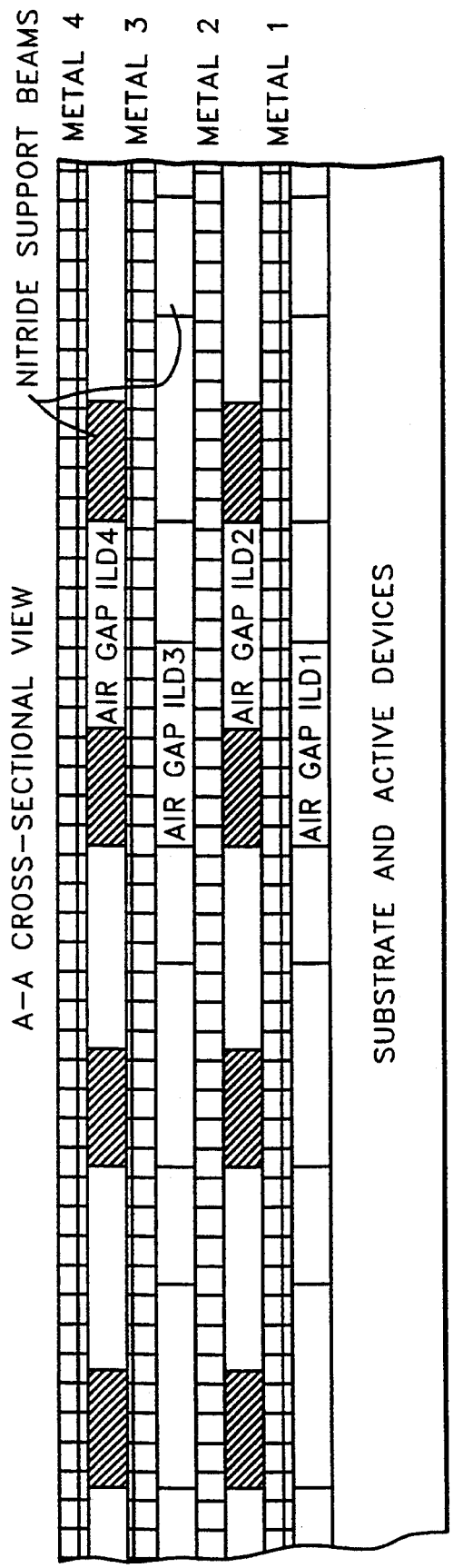
FIGS. 10 and 11 illustrate simplified diagrams representative of a cross-section of a device structure formed from the process steps described herein.
Figure 11:
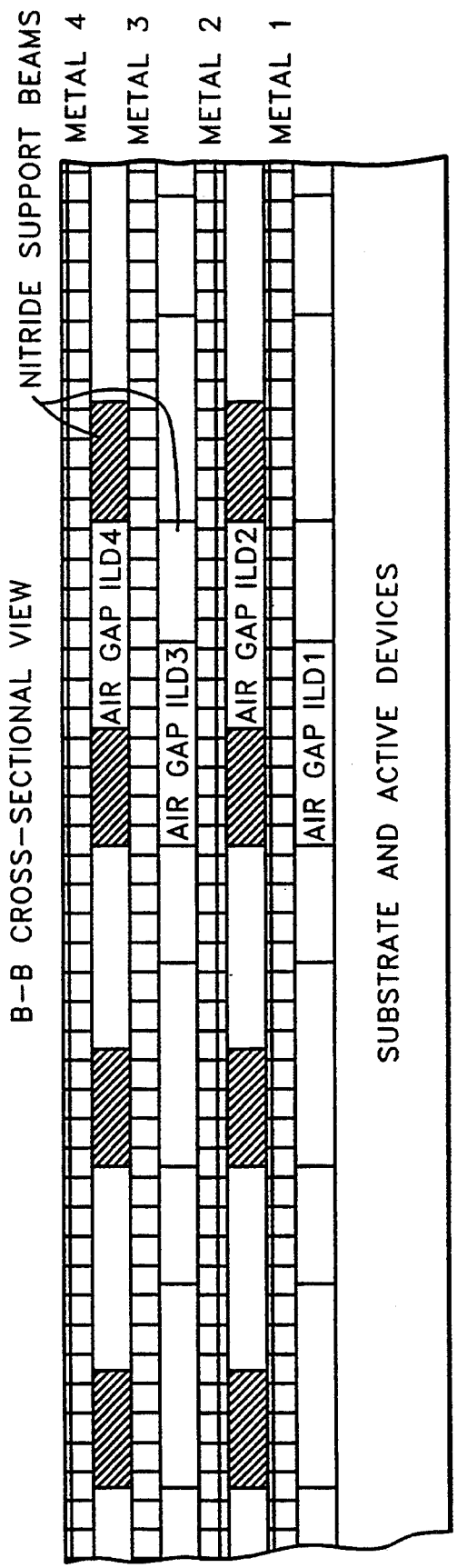
Figure 12:
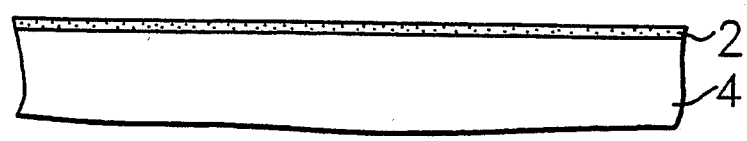

1. With reference to FIG. 1, a cross-sectional view of the resulting structure from the following processing steps, complete the device fabrication through the transistor level. This includes metal 0, local interconnects, etc. This completes the device fabrication up to before the first inter-level dielectric.
2. With reference to FIG. 1, a cross-sectional view of the resulting structure from the following processing steps, deposit a thin (e.g. 1000–2000 Å)layer 2 of silicon nitride (low pressure chemical vapor deposition, LPCVD, plasma enhanced chemical vapor deposition, PECVD, or photochemical) on substrate 4. This layer will act as an etch-stop layer later on to protect field oxide, oxide spacers, and etc.
3. With reference still to FIG. 2a, deposit first planarized interlevel oxide dielectric (ILD1). This can be done by a low temperature ECR deposition (in-situ planarized), or conventional LPCVD/PECVD with resist etch-back (REB) planarization. The overall ILD1 thickness is made to be around 0.5–2 μm. The next step is to perform a microlithography process step (i.e., spin on resist prebake resist, expose, and develop).
4. Use the mask for negative image of hexagonal pattern 1 (shown in FIGS. 2b and 2b[1]) and pattern the photoresist, (This will be a dark-field mask assuming positive photoresist is used). Perform anisotropic oxide etch using optical or timed end-point detection. Stop the plasma etch process using the nitride underlayer as etch stop (adjust over-etch based on optical emission end-point). Strip the photoresist layer. The resulting structure is shown in FIG. 3 which illustrates a cross-sectional view of the resulting structure. The hexagonal pattern 1 etched into the ILDI has a unit cell diagonal dimension on the order of several to 10's of microns. The hexagonal periphery linewidth (trench width in the oxide) can be selected to be the same as the minimum device feature size or somewhat larger (e.g. 1 μm). Smaller linewidths are preferred.
5. Perform conformal silicon nitride deposition using a chemical-vapor deposition (CVD) or plasma-enhanced chemical-vapor deposition (PECVD) process. A good example is ECR (electron cyclotron resonance) plasma deposition. This will fill the trenches (hexagonal trenches) etched into the oxide and leave nitride 2 on that surface as shown in FIG. 4 which illustrates a cross-sectional view of the resulting structure. The resulting structure is hexagonal oxide islands surrounded and sealed by silicon nitride.
6. FIG. 5 shows a cross-sectional view of the resulting structure from using the metal 1 mask (negative image as shown in FIG. 2b) and after patterning the photoresist and etching trenches. The microlithography step employs a negative image of metal pattern (dark-field mask if positive photoresist is used). Perform an anisotropic plasma etch (nitride/oxide) in order to form approximately 0.5–1 μm deep trenches 8 in the interlevel oxide dielectric ILD1. These trenches 8 will contain the final metal 1 structure. Strip the photoresist.
7. Perform via 1 microlithography. Use the via 1 (metal 1-to-metal 0) and pattern the photoresist. Perform anisotropic plasma nitride/oxide/nitride etch to open the contact holes. Via holes 9 are shown in the drawing of FIG. 6 which illustrates a cross-sectional view of the resulting structure.
8. As shown in FIG. 6, deposit a conformal nucleation/glue layer of a suitable material (e.g. TiN, Ti, Cr, etc.) by chemical-vapor deposition (CVD) or physical pressure vapor deposition (PVD). The layer should result in being approximately 250 to 1000 Å thick.
9. As shown in FIG. 7, a drawing illustrating a cross-sectional view of the structure resulting from the following processing steps, deposit a blanket layer of copper (resistivity: 1.7 μΩ. cm) by CVD or another technique. Make the deposition thickness approximately 0.5 μm or larger. This will fill the via holes and dielectric trenches and will result in fairly planar surface copper.
10. Perform a blanket anisotropic copper etch back using a suitable reactive ion etch (RIE) (e.g. hot RIE using chlorine environment) or sputter etch process. Time the etch process with suitable over etch using an optical end-point detection (surface reflectance will change abruptly when the glue layer on flat surface is exposed). Then perform an anisotropic plasma etch back to remove the exposed glue layer. Perform a selective isotropic plasma nitride etch to remove the exposed nitride layer from the top surface. The resulting structure is illustrated in FIG. 8. It is possible to form the metal pattern by chemical-mechanical polishing instead of blanket plasma etch-back. The processes of this step result in formation of a planar structure with metal 1 lines and via hole patterns filled with copper 12.
11. Deposit the second interlevel oxide dielectric (ILD2) to the required thickness by CVD or PECVD. No additional planarization process may be required because the metal 1/ILD1 surface is already fairly planar. A low-temperature dielectric deposition process (e.g. T≦300° C.) with plasma is preferred. Deposit a thin (e.g. 1000 Å) silicon nitride layer by PECVD top of ILD2.
12. Repeat steps 4 through 10; however, this time use the mask for negative image of hexagonal pattern 2 (shown in FIG. 2a). The metal and via patterning steps should employ the metal 2 and via 2 (metal 2 to metal 1) masks. Hexagonal pattern 2 is similar to hexagonal pattern 1, however, its alignment has an offset equal to half of the hexagonal unit cell dimension.
13. Deposit a third interlevel oxide dielectric, (ILD3).
14. Repeat steps 4 through 10. Use the mask for negative image of hexagonal pattern 1 (shown in FIGS. 2b and $2b^1$). Moreover, the metal and via patterning steps should employ the metal 3 and via 3 (metal-3-to-metal 2) masks.
15. Deposit a fourth interlevel oxide dielectric, (ILD4).
16. Repeat steps 4 through 10. Use the mask for negative image of hexagonal pattern 2 (shown in FIGS. 2b and $2b^1$). Moreover, the metal and via patterning steps should employ the metal 4 and via 4 (metal 4-to-metal 3) masks. A cross-sectional view of the resulting structure obtained using steps 11 through 16 is illustrated in FIG. 9. This cross-sectional view is for arbitrary metal and via layout patterns.
17. Perform a timed wet HF or vapor-phase HF oxide-etch process. This will selectively remove all the interlevel oxide dielectric layers in the multi-level interconnect structure without removing the hexagonal nitride support structures and without attacking the multi-level metal structure. Simplified diagrams representative of a cross-section of the structure formed from the foregoing process steps are illustrated in FIGS. 10 and 11. The cross-section represented in FIG. 10 is along lines A—A as illustrated in FIG. 2b. The cross-section represented in FIG. 11 is along lines B—B as illustrated in FIG. 2b.

Alternative Process Flow for Multilevel Metallization:

The following discloses an alternative process for multilevel metallization. Element labels are referenced throughout and correspond to FIGS. 12 through 23 which represent sequential cross-sectional views of the resulting structure obtained from successive processing steps.

Figure 13:
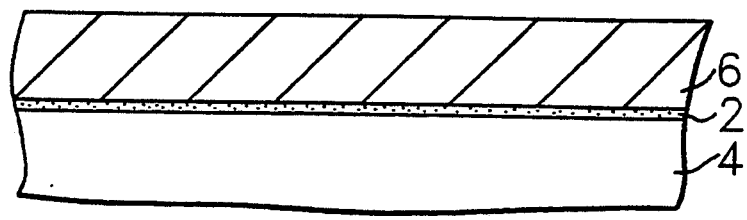
Figure 14:
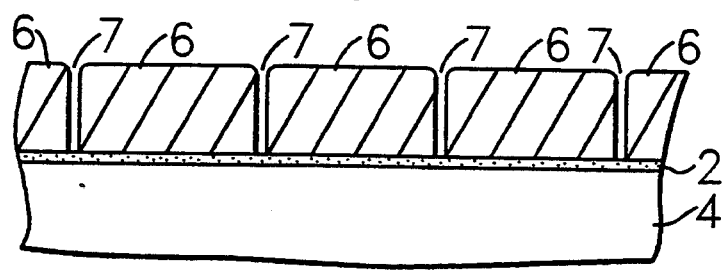
Figure 15:
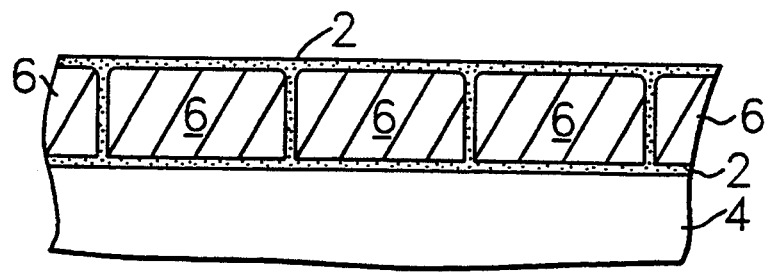
Figure 16:
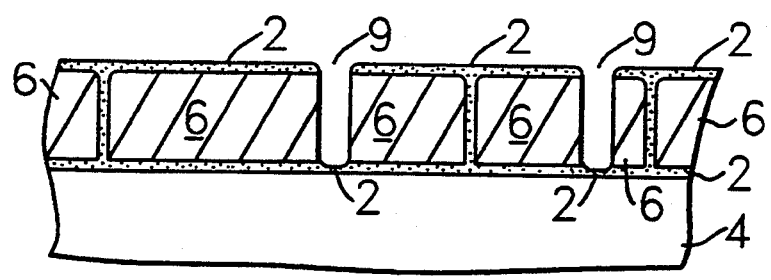
Figure 17:
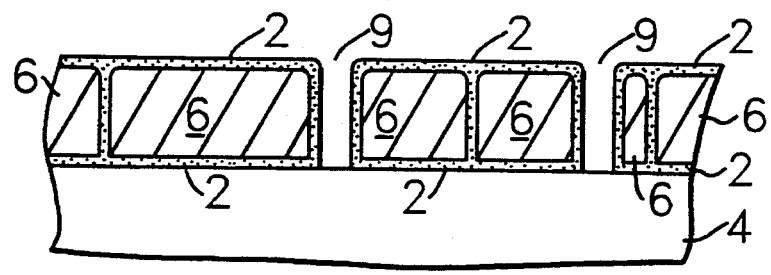
Figure 18:
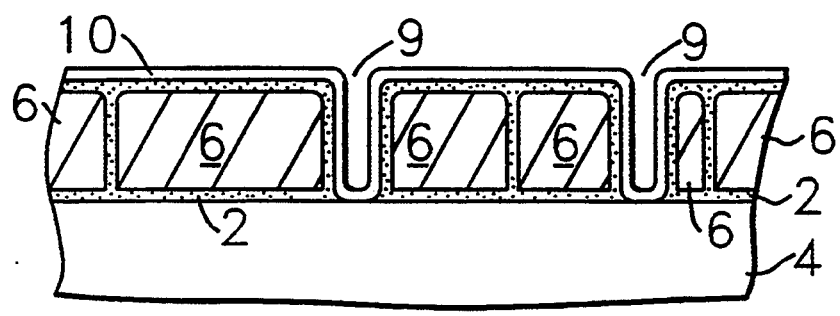
Figure 19:
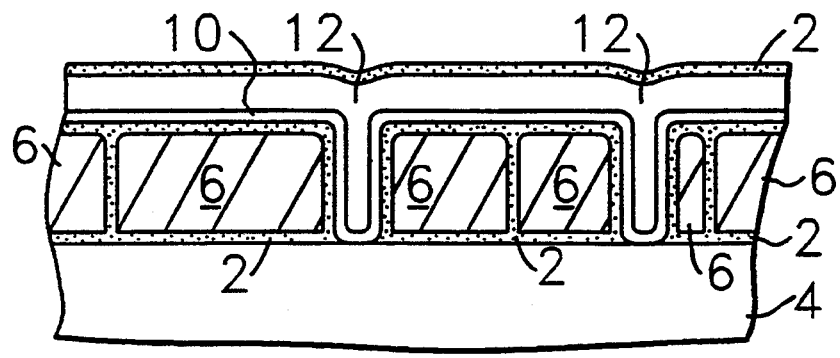
Figure 20:
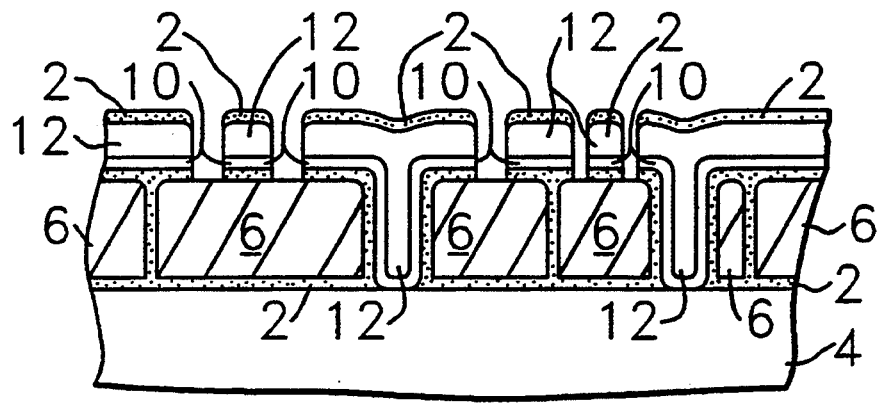
Figure 21:
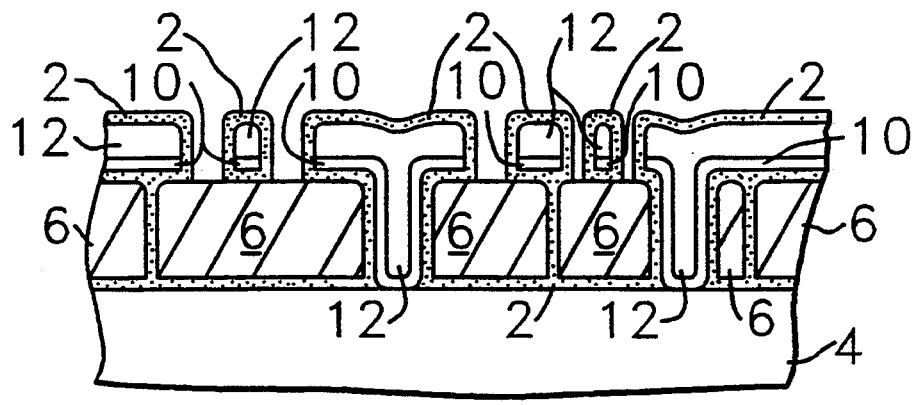

1. Complete the device fabrication process flow up through the transistor level (assume the process flow is for CMOS devices with silicided gate and source drain regions). The process flow may employ conventional transistor level silicide interconnects as well as silicide or metal nitride local interconnects.
2. Deposit a layer (e.g. 1000–2000 Å) of silicon nitride 2, preferably by plasma enhanced chemical-vapor deposition (PECVD) or photochemical processing. CVD may also be used. A buffer layer (underlayer) of stress relief silicon dioxide may be used prior to the nitride deposition. An optional layer of amorphous Si or polysilicon (approximately 1000 Å) may be deposited on nitride (etch stop) as well.
3. Deposit the interlevel oxide dielectric by LPCVD and/or PECVD (undoped, doped PSG/BPSG, and etc) 6. If necessary, use glass reflow and/or resist etch back to planarize the surface (approximately 1 μm oxide). The resulting structure is shown in FIG. 13. The next step is a microlithography patterning step.
4. Use the mask for negative image of "hexagonal pattern 1" (shown in FIGS. 2b and $2b^1$) The hexagonal unit cell has diametric dimension which may be in the range of approximately several to 10's of microns. The hexagonal linewidth can be selected to be as small as the minimum feature size and as large as several times the minimum feature size (e.g. 0.35–1 μm for 0.35 μm technology. Smaller hexagonal linewidths are preferred. Then expose and develop the resist.
5. Perform anisotropic plasma oxide etch. Stop on the bottom etch-stop layer (nitride or silicon/nitride bi-layer). Strip the resist. This will result in vertical trenches with a hexagonal unit cell pattern as shown in drawing of FIGS. 2b and $2b^1$ surrounding hexagonal oxide islands.
6. Perform low-pressure chemical-vapor deposition (LPCVD) of nitride (conformal PECVD nitride such as remote plasma deposition may also be used). Make the deposited nitride thickness at least more than ½ of the hexagonal trench width. This will result in complete filling of the vertical interlevel trenches with silicon nitride. Moreover, the nitride layer covers all the flat surfaces. For instance, for 0.50 μm wide trenches, 3000 Å nitride may be deposited in order to completely fill the vertical trenches surrounding the interlevel oxide islands. The next process step includes microlithography and patterning.
7. Use the via (metal 1-to-metal 0) mask and pattern the photoresist, Perform plasma oxide etching to open the via holes 9 (also referred to as vias) down to the lower $Si_3N_4$ layer which acts as an etch stop. See FIG. 16.
8. Deposit a thin (approximately 250 to 500 Å) nitride layer 20. Perform a RIE (reactive ion etch) step to remove this nitride from the bottom of open via holes. This etch will remove some fraction of the nitride from top surfaces but at least approximately 1000 Å will remain (even with 50 to 100% over etch). The nitride will remain on the via sidewalls and will encapsulate the via plugs. See FIG. 17.
9. Deposit a nucleation and glue layer 10 such as TiN or pure titanium (Ti) by CVD or physical-vapor deposition (PVD). See FIG. 18.
10. Deposit a blanket layer of copper 12 by CVD. This will fill the via holes and form a blanket layer (e.g. 6000 Å) on flat surfaces.
11. Deposit a layer of silicon nitride by LPCVD or PECVD (approximately 2500 Å). This layer will act as top encapsulation/passivation.
12. Use the metal 1 mask and pattern the photoresist and etch pattern into top nitride. Strip resist. Transfer the pattern into copper by anisotropic etch using a process such as hot (approximately 250° C.) RIE in a silane/ammonia/chlorine plasma. Continue to etch through the underlayer of glue (TiN) by a suitable etch process. Continue the etch by removing the exposed nitride layer from the bottom surface. This will still leave a fraction of nitride on top of the metal line.
13. Perform LPCVD or PECVD nitride process for conformal depositing of silicon nitride 14 (approximately 250 to 500 Å). Then perform an RIE process to remove excess silicon nitride from bottom flat surfaces. The copper interconnect lines are now fully encapsulated in silicon nitride.
14. Deposit the second interlevel oxide (ILD1) 15 and perform planarization by resist etch-back or another technique, as required.
15. Go to step 4. However, this time use the mask for negative imaging of hexagonal pattern 2 (shown in FIGS. 2b and $2b^1$) which has hexagonal unit cells with displaced position with respect to the hexagonal pattern 1 on the lower level (displaced by half unit cell dimension).
16. Proceed with steps similar to those previously described in steps 5 through 13 using the via 2 and metal 2 masks. These will result in formation of metal 2 to metal 1 via plugs and metal 2 interconnects.
17. Repeat step 4 with the mask for negative imaging of hexagonal pattern 1. Then repeat step 16 with the via 3 and metal 3 masks. These will result in formation of metal 3-to-metal 2 via plug and metal 3 interconnects.

18. Repeat step 4 with the mask for negative image of hexagonal pattern 2. Then repeat step 16 with the via 4 and metal 4 masks. These will result in formation of metal 4-to-metal 3 via plug, and metal 4 interconnects. In this example, metal 4 is the last interconnect level in the multilevel interconnect system.

19. Perform a wet HF or vapor-phase HF oxide strip process. This will remove all the interlevel oxide dielectric layers in the entire multilevel interconnect structure. The etch process is highly selective to oxide removal and will remove only a very small amount of the exposed nitride structure. The result of this process is a fully encapsulated multilevel copper interconnect structure (with silicon nitride encapsulation). The interconnect structure is mechanically supported by multilevel hexagonal silicon nitride cells. The interlevel dielectrics are free space. Diagrams representative of a cross-section of a structure formed from the foregoing process steps are illustrated in FIGS. 10 and 11.

Note that the last step will not attack or remove any exposed material layers other than the interlevel oxide dielectrics. The transistor level including field oxide is protected by the remaining nitride layer on the active devices.

Formation of Continuous Passivation Overlayer of Silicon Nitride and Hermetically Sealed Chip Packages The formation of passivation overlayer and hermetically sealed packages for chips with using the free space dielectric multilevel interconnect technology of this invention is also contemplated herein. Consequently, a simple technique is proposed in order to form a continuous passivation overlayer of silicon nitride or silicon oxynitride in any of the two previously discussed fabrication flows. This passivation overlayer is required in order to form the bonding pad openings and to protect the chip against environmental and contamination sources. This process module is added to the original interconnect fabrication flow or to the simplified/preferred flow before the last wet HF or vapor-phase HF step. The protective overcoat (P.O.) layer formation, pad opening, and hermetic packaging proceed as follows:

A) Deposit a relatively thick (0.5–1 $\mu$m) layer of silicon nitride (or oxynitride, nitride is preferred) by LPCVD or PECVD (low-temperature PECVD is preferred). This is done after formation of the topmost metal level (after step 18/before step 19 in the alternative flow; after step 16 and before step 17 in the first flow).

Figure 24:
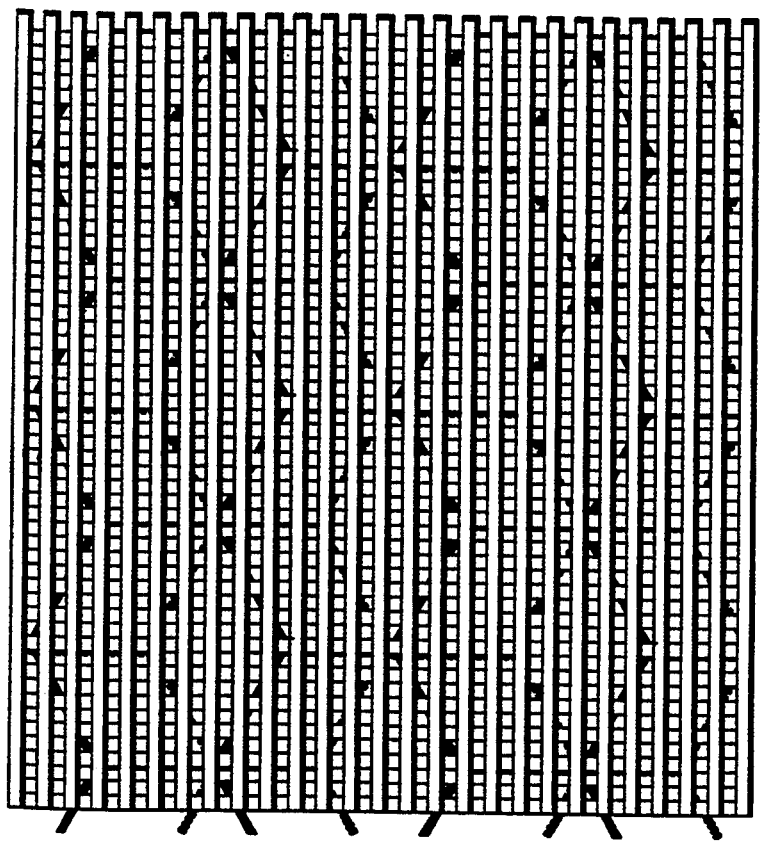
FIG. 24 illustrate a top view of the grid pattern for the nitride or oxynitride passivation overlayer superimposed on top of the hexagonal nitride support structure prior to a passivation overlayer sealing process.
Figure 22:
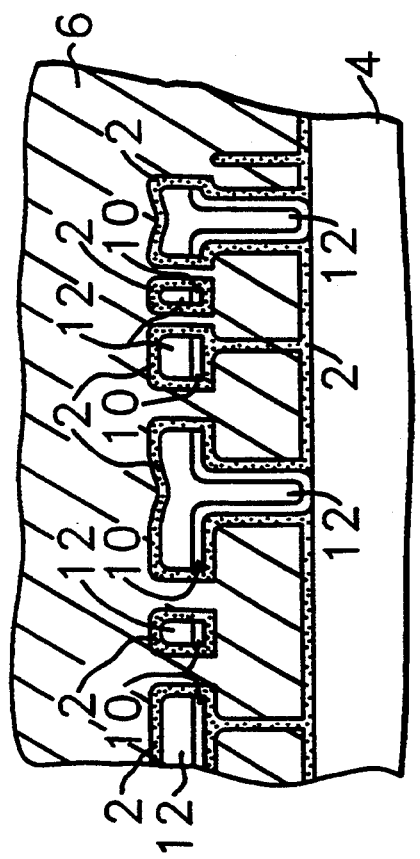
Figure 23:
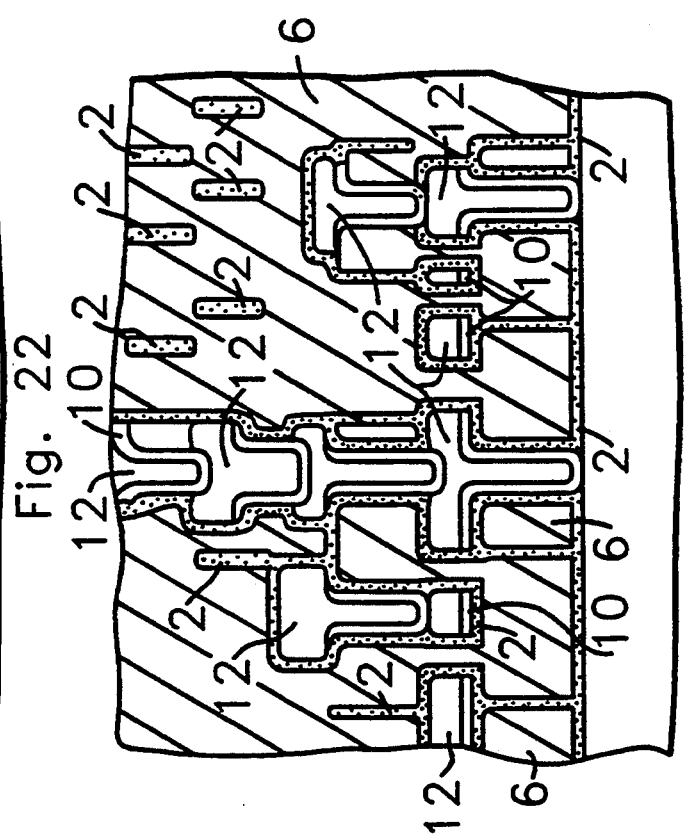

B) Use the P.O. microlithography mask and pattern photoresist to open the area corresponding to the bonding pads and also to open a grid-type structure, similar to that shown in FIG. 24. FIG. 24 illustrates a top view of the grid for the nitride overlayer superimposed on top of the hexagonal nitride support structure prior to a passivation overlayer sealing process. The openings in the grid structure have minimum size dimensions (e.g. 0.35 $\mu$m for 0.35 $\mu$m technology). For simplicity, assume the lines and spaces all have minimum feature dimensions (0.35×0.35 $\mu$m$^2$ grid squares). Then perform anisotropic nitride etch to transfer the pattern from photoresist into the nitride P.O. layer. Strip the photoresist. Note that numerous grid openings fall on top of each hexagonal cell. This is due to the fact that the hexagonal cell area is much larger than the grid cell area.

C) Perform a timed wet HF or vapor-phase HF etch process (previously step 17 in the original flow and step 19 in the alternative flow). This will remove the interlevel oxide dielectrics from the entire multi-level metal structure without attacking the nitride structures (hexagonal-array beams, top patterned nitride, etc.) and without attacking the metal structures. The grid structure on the top nitride allows complete etch access to all the ILD layers. The post-etch structure has full mechanical stability.

D) Perform a conformal (preferably low-temperature) silicon nitride deposition by LPCVD or PECVD (e.g. ECR plasma deposition). This layer may also be oxynitride. Adjust the deposition time to make the thickness larger than $\frac{1}{2}$ of the grid opening (e.g. 0.2 $\mu$m thick for 0.35 $\mu$m grid openings). This conformal deposition will form a thin conformal passivation layer coating of nitride or oxynitride (approximately 0.2 $\mu$m thick) on all the multi-level metal structures including the metal lines and via plugs. It also completely seals the top P.O. nitride grid openings due to conformal sidewall deposition. A thin layer of nitride ($\sim$0.2 $\mu$m) is also deposited on the top flat surfaces, including the exposed bonding pads.

E) Perform a timed isotropic blanket plasma nitride etch to remove approximately 0.2–0.3 $\mu$m silicon nitride. This will again expose the bonding pads but will not remove the P.O. nitride layer. Only 0.2–0.3 $\mu$m of the P.O. nitride is removed. As a result, 0.5–1 $\mu$m P.O. nitride layer (fully sealed) will remain on the top of the entire structure (with the exception of the bonding pads).

F) Connect the bonding pads.

G) Proceed with a process to fabricate the hermetically sealed packaged chip. Note that this process can be done in a controlled ambient such as air or nitrogen. The space or gaps in the multi-level metal structure can be filled with a suitable gas (with a high breakdown field) at atmospheric, low, or above atmospheric pressures.

Note the following:

1. This process does not employ any additional mask to complete the top P.O. nitride sealing process. The P.O. mask is also used to form the grid structure on the P.O. layer. The grid is initially used to perform the selective oxide removal process and is finally sealed by another conformal nitride deposition step.

2. Gas breakdown—The structure must be designed to prevent free space gas breakdown between metal layers in the structure. The dielectric breakdown of air at atmospheric pressures is $\sim$31 kV/cm. (3.1 V/$\mu$m). At atmospheric pressure, the dielectric breakdown of $CO_2$ is higher than air by a factor of 1.2. For $N_2$ this factor is 1.16. The dielectric strengths of gases increases with pressure. At a pressure of 2–3 atm., $N_2$ has a dielectric strength which is $\sim$1.15 times larger than that of air. As a result, the preferred method of hermetic packaging is in a high-pressure controlled $N_2$ environment. The pressure may be in the 1–5 atm (or even higher) range. This will prevent micro-discharge in the multi-level metal structure with $N_2$ filled space.

It is preferred not to use on rough vacuum free space dielectric in the multi-level metal structure. This is due to the fact that vacuum-sealed packaged chip may suffer from field-induced electron emissions. However, good vacuum can provide a dielectric breakdown field as high as 5.4 MV/cm. (tunneling will happen above these fields).

Therefore, the preferred choices of free space dielectric medium are the following:

1. High-pressure (e.g. 1-5 atm) medium of nitrogen.
2. High vacuum ($P \leq 10^{-6}$ torr) medium Considering these provisions, gas breakdown in the metal structure will not be a problem.

Although the invention has been described in detail herein with reference to preferred embodiments and certain described alternatives, it is to be understood that this description is by way of example only, and is not to be construed in a limiting sense. It is to be further understood that numerous changes in the details of the embodiments of the invention, and additional embodiments of invention, will be apparent to, and may be made by persons of ordinary skill in the art having reference to this description. It is contemplated that all such changes and additional embodiments are within the sirit and true scope of the invention as claimed below.

I claim:

1. A process for forming a structure having a multi-level metalization on an integrated circuit formed on a substrate having a substantially planar surface comprising the steps of:
   (a) forming, as part of one level, a plurality of dielectric islands in a desired island pattern on said substantially planar surface;
   (b) surrounding said islands with a supporting material;
   (c) selectively forming electrically conductive vias and trenches in said islands and leaving a substantially planar surface;
   (d) depositing an interlevel layer over said planar surface to produce a new substantially planar surface; and
   (e) repeating steps (a) through (d), where said substantially planar surface in step (a) is said new substantially planar surface created in the previously executed step (d), a selected number of times with the projection of said island pattern in any one level being non-congruent with said island pattern of the level immediately below said any one level.

2. The process according to claim 1 additionally including the step of:
   (f) removing, after step (e), said islands and said interlevel layers.

3. A process as recited in claim 1 wherein each said island pattern is hexagonally shaped.

4. A process as recited in claim 1 wherein said substrate is selected from the group of semiconductor materials consisting of silicon, gallium arsenide, and germanium.

5. A process as recited in claim 1 comprising placing a passivation overlayer over the final structure created by steps (a) through (e).

6. A process as recited in claim 5 wherein said passivation overlayer is formed by the steps comprising:
   (f) placing a layer of a third dielectric material over the planar surface produced in the last executed step d;
   (g) etching areas in said third dielectric material according to a desired pattern so as to etch areas in said third dielectric material corresponding to bonding pad locations;
   (h) forming a bonding pad made of an electrically conductive material at each said bonding pad location;
   (i) placing a conformal layer over the structure thus formed by the foregoing processing steps;
   (j) etching said conformal layer so as to remove said conformal layer from said bonding pads.

7. A process as recited in claim 6 which further includes the steps of:
   (k) connecting said bonding pads to lead wires;
   (l) fabricating a hermetically sealed package in a controlled ambient selected from the group consisting of air, nitrogen and vacuum.

8. A process as recited in claim 1 wherein said electrically conductive vias and trenches are made of a material selected from the group consisting of copper, aluminum, tungsten and their alloys.

9. A process as recited in claim 1 wherein a glue layer is formed as part of step c between said electrically conductive vias and trenches and said dielectric islands.

10. The process according to claim 1 wherein said interlevel layer includes a patterned conductive material.

* * * * *